United States Patent
Ryu et al.

(10) Patent No.: US 10,949,008 B2
(45) Date of Patent: Mar. 16, 2021

(54) DISPLAY DEVICE

(71) Applicant: Samsung Display Co., Ltd., Yongin-Si (KR)

(72) Inventors: Seung-soo Ryu, Hwaseong-si (KR);
Seung-hwan Cho, Yongin-si (KR);
Byoungyong Kim, Seoul (KR);
Daeyoung Joung, Seongnam-si (KR);
Young-cheol Jeong, Hwaseong-si (KR);
Jeongho Hwang, Cheonan-si (KR)

(73) Assignee: Samsung Display Co., Ltd.

( * ) Notice: Subject to any disclaimer, the term of this patent is extended or adjusted under 35 U.S.C. 154(b) by 69 days.

(21) Appl. No.: 16/203,484

(22) Filed: Nov. 28, 2018

(65) Prior Publication Data

US 2019/0196632 A1 Jun. 27, 2019

(30) Foreign Application Priority Data

Dec. 21, 2017 (KR) .......................... 10-2017-0177449

(51) Int. Cl.
| | | |
|---|---|---|
| *G06F 3/041* | (2006.01) | |
| *H01L 27/32* | (2006.01) | |
| *G06F 3/044* | (2006.01) | |
| *G09G 3/3233* | (2016.01) | |

(52) U.S. Cl.
CPC ............ *G06F 3/0412* (2013.01); *G06F 3/044* (2013.01); *H01L 27/323* (2013.01); *H01L 27/3276* (2013.01); *G06F 3/0416* (2013.01); *G09G 3/3233* (2013.01)

(58) Field of Classification Search
CPC ...... G06F 3/0412; G06F 3/0416; G06F 3/044; H01L 27/323; H01L 27/3276; G09G 3/3233
See application file for complete search history.

(56) References Cited

U.S. PATENT DOCUMENTS

| | | | |
|---|---|---|---|
| 6,282,088 B1 * | 8/2001 | Canova ................. | G06F 1/1632 292/8 |
| 2013/0135229 A1 * | 5/2013 | Wang .................... | G06F 1/1643 345/173 |
| 2014/0022187 A1 * | 1/2014 | Jeong ..................... | G06F 3/046 345/173 |
| 2014/0339574 A1 * | 11/2014 | Kang .................. | G02F 1/13452 257/88 |
| 2015/0091809 A1 * | 4/2015 | Ibargoyen ............. | G06F 1/1643 345/173 |

(Continued)

FOREIGN PATENT DOCUMENTS

| | | |
|---|---|---|
| KR | 10-1396944 B1 | 5/2014 |
| KR | 10-2015-0011731 A | 2/2015 |
| KR | 10-2015-0047711 A | 5/2015 |

*Primary Examiner* — Abbas I Abdulselam
(74) *Attorney, Agent, or Firm* — Innovation Counsel LLP

(57) ABSTRACT

A display device may include a display panel, an input sensing unit, and a driving circuit board. The display panel includes a base substrate and a driving pad, and the input sensing unit includes an encapsulation substrate and an input pad. The driving circuit board may be provided on one of side surfaces of the base substrate adjacent to the driving pad and on one of connection surfaces of the encapsulation substrate adjacent to the input pad and may be electrically connected to the driving pad and the input pad, respectively.

20 Claims, 12 Drawing Sheets

(56) References Cited

U.S. PATENT DOCUMENTS

| | | | |
|---|---|---|---|
| 2015/0185942 A1* | 7/2015 | Kim | G06F 3/0412 |
| | | | 345/173 |
| 2015/0277629 A1* | 10/2015 | Kao | G06F 3/044 |
| | | | 345/174 |
| 2016/0079337 A1* | 3/2016 | Mathew | H01L 51/0096 |
| | | | 257/40 |
| 2016/0282984 A1* | 9/2016 | Chang | G06F 3/0416 |
| 2016/0377905 A1* | 12/2016 | Choi | G02F 1/13458 |
| | | | 257/72 |
| 2017/0005083 A1* | 1/2017 | Choi | H01L 51/5237 |
| 2017/0069692 A1* | 3/2017 | Lee | G06F 3/044 |
| 2017/0082900 A1* | 3/2017 | Kong | G02F 1/13458 |
| 2017/0123569 A1* | 5/2017 | Kim | G06F 3/03545 |
| 2018/0143717 A1* | 5/2018 | An | G06F 3/044 |

\* cited by examiner

DISPLAY DEVICE

CROSS-REFERENCE TO RELATED APPLICATIONS

This U.S. non-provisional patent application claims priority under 35 U.S.C. § 119 to Korean Patent Application No. 10-2017-0177449, filed on Dec. 21, 2017, in the Korean Intellectual Property Office, the disclosure of which is hereby incorporated by reference in its entirety.

BACKGROUND OF THE INVENTION

The present disclosure relates to a display device, and in particular, to a display device including a display panel and an input sensing unit.

A module assembling system is one of back-end systems for fabricating a display panel, used to electrically connect the display panel and a driver chip. Depending on a connection process, a method of mounting the driver chip is classified into a chip-on-glass (COG) mounting method and a tape-automated-bonding (TAB) mounting method.

In the COG mounting method, a driver chip is directly mounted on a gate region and a data region of a display panel and is used to transmit electrical signals to the display panel. In general, an anisotropic conductive film (ACF) is used to bond the driver chip to the display panel.

In the TAB mounting method, a tape carrier package mounted with a driver chip is bonded to a display panel. In this method, an anisotropic conductive film is used to bond the display panel to an end region of a tape carrier package and to bond a main circuit board to another end region of the tape carrier package.

In order to allow a display device to have an enlarged display region, a method of disposing a tape carrier package on a side surface of a display panel has been recently studied.

SUMMARY

Some embodiments of the inventive concept provide a display device that is configured to allow a display region to have an increased area.

According to some embodiments of the inventive concept, a display device may include a display panel including a base substrate, in which a display region and a non-display region adjacent to the display region are defined, and a driving pad that overlaps the non-display region, the base substrate including a top surface, a bottom surface, and side surfaces connecting the top surface to the bottom surface and the driving pad being provided on the top surface of the base substrate, an input sensing unit including an encapsulation substrate and an input pad, the encapsulation substrate including a first surface facing the top surface of the base substrate, a second surface, and connection surfaces connecting the first surface to the second surface, the input pad overlapping the non-display region and being provided on the first surface of the encapsulation substrate, and a driving circuit board provided on a first side surface of the side surfaces adjacent to the driving pad, and on a first connection surface of the connection surfaces adjacent to the input pad, and electrically connected to the driving pad and the input pad, respectively.

In some embodiments, the display device may further include a driving side electrode provided on the first side surface and the first connection surface to electrically connect the driving circuit board to the driving pad.

In some embodiments, an end portion of the driving pad may be aligned to the first side surface and may be in contact with the driving side electrode.

In some embodiments, the driving circuit board may include a pad that is provided to face the driving side electrode and is electrically connected to the driving side electrode.

In some embodiments, the display device may further include an anisotropic conductive film that is provided between the driving side electrode and the pad to electrically connect the driving side electrode to the pad.

In some embodiments, the display device may further include a sub-driving pad that is in contact with the driving side electrode and is provided on the driving pad to electrically connect the driving side electrode to the driving pad.

In some embodiments, the driving side electrode may include a first side electrode that is provided on the first side surface and the first connection surface, and a second side electrode that is extended from the first side electrode and is provided on the driving pad.

In some embodiments, the display device may further include a sub-driving pad that is in contact with the first side electrode and is provided on the second side electrode.

In some embodiments, the display device may further include an input side electrode that is provided on the first side surface and the first connection surface to electrically connect the driving circuit board to the input pad.

In some embodiments, an end portion of the input pad may be aligned to the first connection surface and may be in contact with the input side electrode.

In some embodiments, the driving circuit board may include a pad that is provided to face the input side electrode and is electrically connected to the input side electrode.

In some embodiments, the display device may further include an adhesive member that is provided between the top surface and the first surface to connect the display panel to the input sensing unit.

In some embodiments, the input sensing unit may further include a conductive layer provided on the first surface of the encapsulation substrate, the conductive layer including sensing electrodes, and an insulating layer provided on the conductive layer. The insulating layer may be spaced apart from the top surface of the base substrate with the adhesive member interposed therebetween. The input pad may be electrically connected to the sensing electrodes.

In some embodiments, the adhesive member may be provided to surround the display region and may overlap the non-display region.

In some embodiments, each of the first side surface and the first connection surface may be inclined at an angle, and an angle of the first side surface and an angle of the first connection surface may be supplementary angles when measured relative to a direction perpendicular to a thickness direction of the display panel.

In some embodiments, the angle of the first connection surface may be acute or obtuse when measured relative to the direction perpendicular to the thickness direction of the display panel.

In some embodiments, the first side surface and the first connection surface may be aligned to each other in a thickness direction of the display panel.

According to some embodiments of the inventive concept, a display device may include a display panel including a base substrate, in which a display region and a non-display region adjacent to the display region are defined, and a driving pad that overlaps the non-display region, the base substrate including a top surface, a bottom surface, and side surfaces connecting the top surface to the bottom surface and the driving pad being provided on the top surface of the base substrate, a thin encapsulation layer provided on the top surface of the base substrate to cover the driving pad, an input sensing unit provided on the thin encapsulation layer, the input sensing unit including a cover substrate and an input pad, the cover substrate including a first surface, a second surface, and connection surfaces connecting the first surface to the second surface, the input pad overlapping the non-display region and being provided on the first surface, and a driving circuit board provided on a first side surface of the side surfaces adjacent to the driving pad, and on a first connection surface of the connection surfaces adjacent to the input pad, and electrically connected to the driving pad and the input pad, respectively.

In some embodiments, the display panel may further include a circuit layer provided on the base substrate, and a display device layer provided on the circuit layer. The thin encapsulation layer may cover the display device layer.

In some embodiments, the input sensing unit may further include a conductive layer electrically connected to the input pad, the conductive layer including sensing electrodes that are directly disposed on the thin encapsulation layer and an insulating layer provided on the conductive layer. The cover substrate may be provided on the insulating layer.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1:
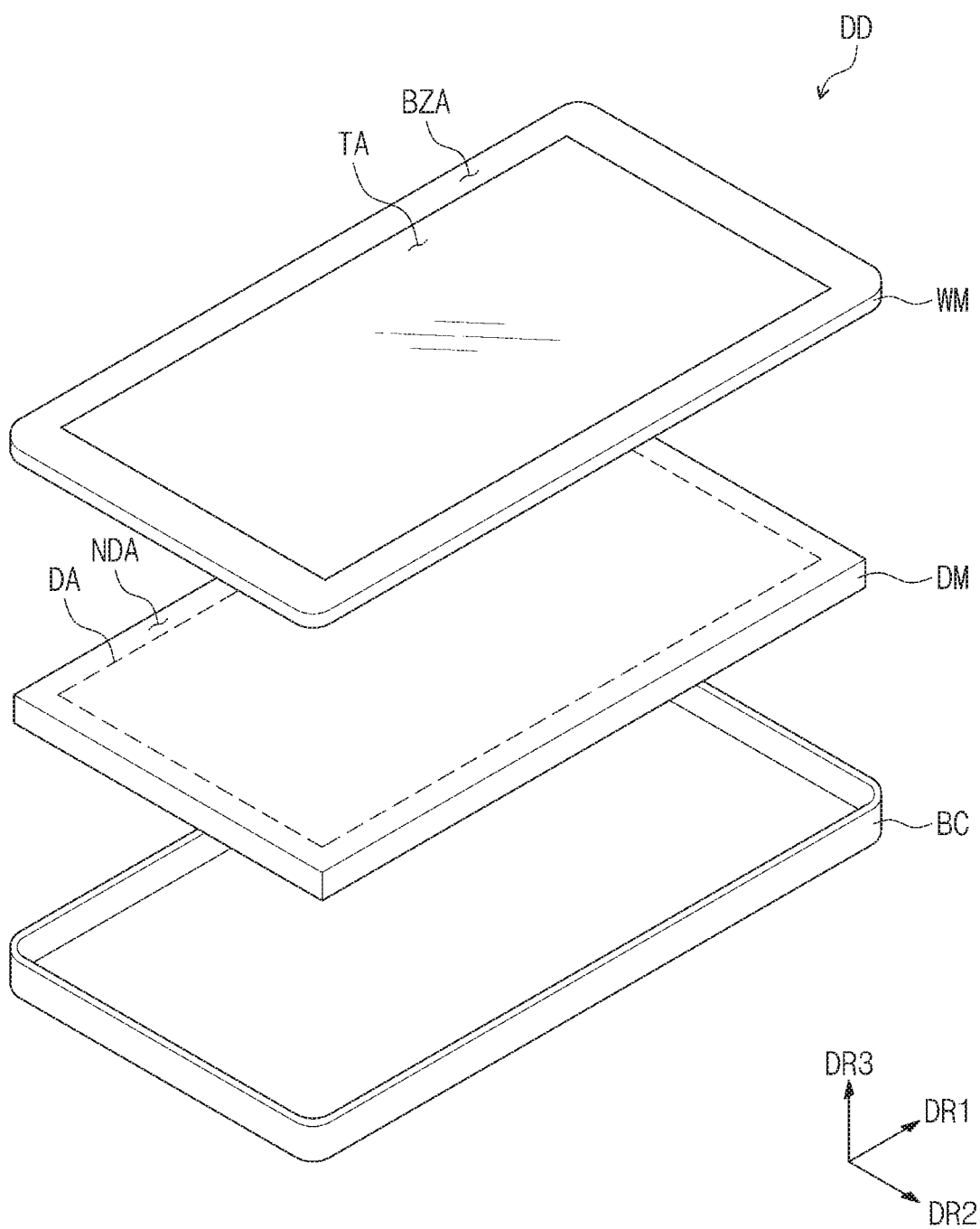
FIG. 1 is an exploded perspective view illustrating a display device according to some embodiments of the inventive concept.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the present inventive concept will now be described more fully with reference to the accompanying drawings, in which example embodiments are shown. Example embodiments of the inventive concept may, however, be embodied in many different forms and should not be construed as being limited to the embodiments set forth herein; rather, these embodiments are provided so that the present disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or one or more intervening elements may be present. In contrast, when an element is referred to as being "directly connected" or "directly coupled" to another element, there may be no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations), and the spatially relative descriptors used herein may be interpreted accordingly.

The terminology used herein is for the purpose of describing particular embodiments only and is not intended to be limiting of example embodiments. As used herein, the singular forms "a," "an," and "the" are intended to include the plural forms as well, unless the context clearly indicates otherwise. It will be further understood that the terms "comprises", "comprising", "includes," and/or "including," if used herein, specify the presence of stated features, integers, steps, operations, elements, and/or components, but do not preclude the presence or addition of one or more other features, integers, steps, operations, elements, components, and/or groups thereof.

Figure 2A:
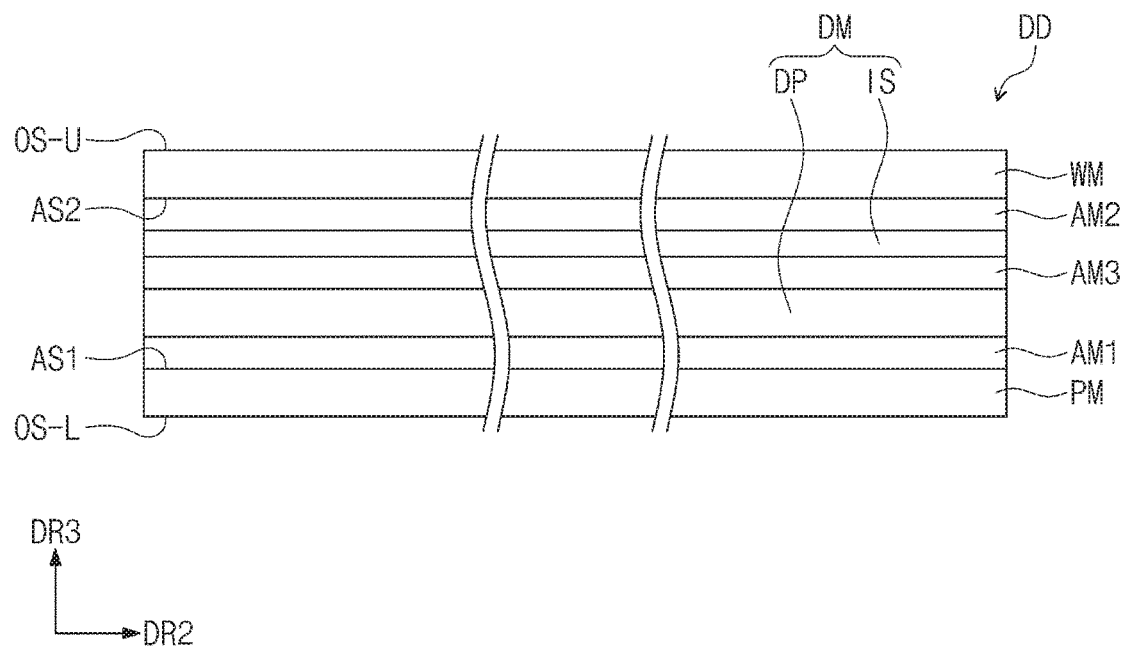
FIG. 2A is a sectional view illustrating a display device according to some embodiments of the inventive concept.
Figure 2B:
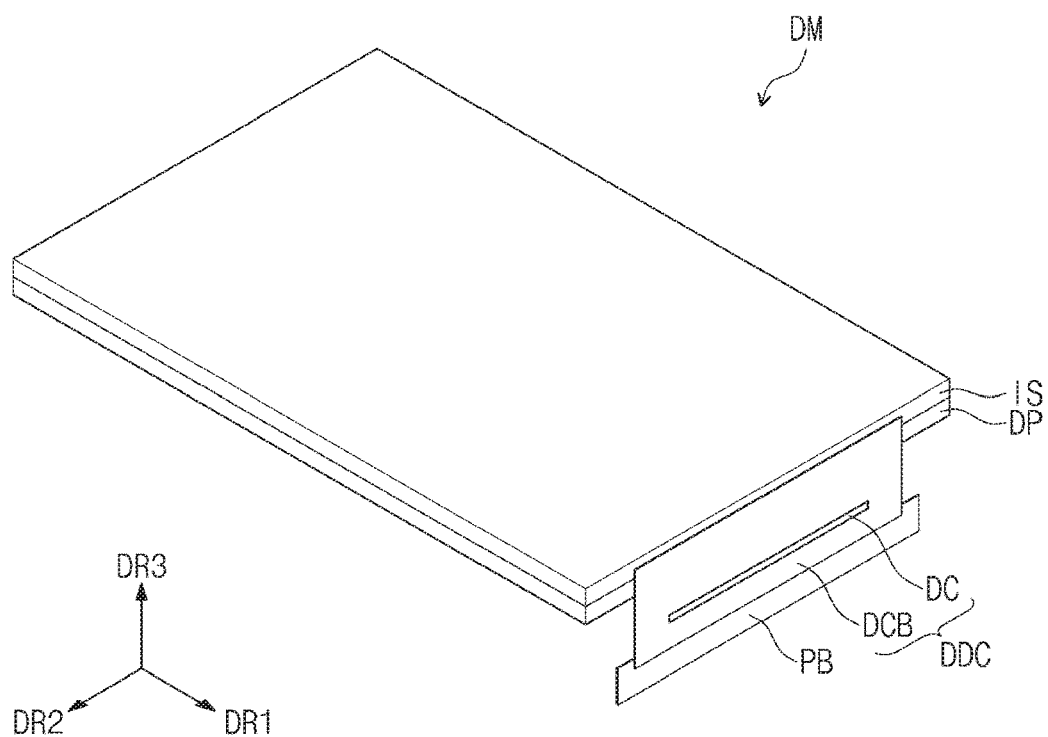
FIG. 2B is a perspective view illustrating a display module shown in FIG. 2A.

FIG. 1 is an exploded perspective view illustrating a display device according to some embodiments of the inventive concept. FIG. 2A is a sectional view illustrating a display device according to some embodiments of the inventive concept. FIG. 2B is a perspective view illustrating a display module shown in FIG. 2A.

In some embodiments, a display device DD may be activated by an electrical signal applied thereto. The display device DD may be provided in various forms. For example, the display device DD may be one of tablets, notebook computers, smart televisions, and so forth. In the present embodiment, the display device DD may be a smart phone, as illustrated in FIG. 1.

Referring to FIGS. 1 and 2A, the display device DD may include a protection member PM, a window WM, a display module DM, a first adhesive member AM1, a second adhesive member AM2, and a third adhesive member AM3. The display device DD may include a bottom chassis BC that is coupled to the window WM and is used to contain the display module DM.

The display module DM may be provided between the protection member PM and the window WM. The first adhesive member AM1 may be used to couple the display module DM to the protection member PM, and the second adhesive member AM2 may be used to couple the display module DM to the window WM. In some embodiments, the first adhesive member AM1 and the second adhesive member AM2 may be omitted.

Each of the first adhesive member AM1 and the second adhesive member AM2 may be formed of or include an optically clear adhesive (OCA) film, an optically clear resin (OCR), or a pressure sensitive adhesive (PSA) film. Each of the first adhesive member AM1 and the second adhesive member AM2 may include a photo-curable adhesive material or a heat-curable adhesive material, but the inventive concept is not limited to the specific material thereof.

The protection member PM may be provided to protect the display module DM. The protection member PM may have a first outer surface OS-L that is exposed to an outside and an adhesion surface AS1 that is attached to the first adhesive member AM1. Hereinafter, the adhesion surface AS1 of the protection member PM will be referred to as a first adhesion surface AS1 to distinguish it from an adhesion surface of another member. The protection member PM may be configured to prevent outer moisture from being infiltrated into the display module DM and to absorb an external impact or shock.

The protection member PM may include a plastic film serving as a base layer. The plastic film included in the protection member PM may contain a plastic resin selected from the group consisting of polyethersulfone (PES), poly- acrylate (PA), polyetherimide (PEI), polyethylene naphthalate (PEN), polyethylene terephthalate (PET), polyphenylene sulfide (PPS), polyarylate (PAR), polyimide (PI), polycarbonate (PC), poly(arylene ether sulfone), and any combination thereof.

Materials of the protection member PM may not be limited to plastic resins, and organic/inorganic composites may be used for the protection member PM. The protection member PM may include a porous organic layer and an inorganic material that is formed to fill pores of the organic layer. The protection member PM may further include one or more functional layers formed on the plastic film. A functional layer may include a resin layer that is formed by a coating method.

The window WM may be configured to protect the display module DM from an external impact and to provide a display surface to a user. The window WM may have a second outer surface OS-U that is exposed to the outside and is used as the display surface and an adhesion surface AS2 that is attached to the second adhesive member AM2. Hereinafter, the adhesion surface AS2 of the window WM will be referred to as a second adhesion surface AS2 to distinguish it from an adhesion surface of another member, for example, the first adhesion surface AS1.

The window WM may include a transparent region TA that is used to display an image. The transparent region TA may have a rectangular shape whose sides are parallel to a first direction DR1 or a second direction DR2. However, the inventive concept is not limited to the above example, and the shape of the transparent region TA may be variously changed.

The window WM may further include a bezel region BZA provided near the transparent region TA. The bezel region BZA may be provided to surround the transparent region TA. However, the inventive concept is not limited to the above example, and the bezel region BZA may be provided in one or more of side regions of the transparent region TA or may be omitted. The inventive concept is not limited to a specific type of electronic device.

The display module DM may be provided to be parallel to the first direction DR1 and the second direction DR2. A third direction DR3 may represent a direction normal to a top surface of the display module DM. The third direction DR3 may be parallel to a thickness direction of the display module DM. A front or top surface and a rear or bottom surface of each member may be distinguished from each other based on the third direction DR3. However, directions indicated by the first to third directions DR1, DR2, and DR3 may be relative to each other, and in certain embodiments, they may be changed to indicate other directions.

The display module DM may include a display panel DP that is configured to display an image and an input sensing unit IS that is configured to sense a user input provided from the outside. The user input may include various types of external inputs, such as a part of a user's body, light, heat, or pressure.

The display panel DP may include a display region DA that is used to display an image, and a non-display region NDA that is located near the display region DA. For example, the non-display region NDA may be provided to surround the display region DA. As an example, the non-display region NDA may be located near at least one or more of side regions of the display region DA or may be omitted. In addition, the display region DA may correspond to the transparent region TA of the window WM, and the non-display region NDA may correspond to the bezel region BZA of the window WM.

Although not shown, the input sensing unit IS may include an active region corresponding to the display region DA and a non-active region corresponding to the non-display region NDA. The active region may be a region that is used to sense an external input, and the non-active region may be another region that is not used to sense the external input and is provided to surround the active region.

The third adhesive member AM3 may be configured to couple the display panel DP to the input sensing unit IS. The third adhesive member AM3 may be a sealing material and may be provided to surround the display region DA and to overlap the non-display region NDA. In certain embodiments, the third adhesive member AM3 may be omitted, and in this case, the display panel DP and the input sensing unit IS may be sequentially stacked by a successive process.

In some embodiments, the display panel DP may be an organic light emitting diode display panel, a liquid crystal display panel, a plasma display panel, an electrophoretic display panel, a microelectromechanical system (MEMS) display panel, or an electrowetting display panel.

The description that follows will refer to an example in which the display panel DP is an organic light emitting display panel. However, it is noted that the display panel DP may not be limited to the organic light emitting display panel and can be any of the above-listed types of display panels without deviating from the scope of the present inventive concept.

Referring to FIG. 2B, the display device DD may further include a driving circuit DDC that is configured to provide electrical signals to the display panel DP and the input sensing unit IS. The driving circuit DDC may be provided in the form of a tape carrier package (TCP).

Since FIG. 2B shows an embodiment in which the display device DD configured as a smart phone, only one driving circuit DDC is illustrated, but the inventive concept is not limited thereto. For example, the display device DD may include a plurality of driving circuits, at least one of which includes input pads that are used to provide driving signals to the input sensing unit IS.

In FIG. 2B, the driving circuit DDC is illustrated to be provided on one of the side surfaces of the display module DM, but in certain embodiments, a plurality of driving circuits DDC may be provided on at least one of the side surfaces of the display module DM.

The driving circuit DDC may include a driving circuit board DCB and a driving chip DC that is provided on the driving circuit board DCB. The driving circuit board DCB may be electrically connected to the display panel DP and the input sensing unit IS, respectively.

In some embodiments, the driving circuit board DCB may be provided in the form of a flexible printed circuit board. For example, the driving circuit board DCB may be bent to be placed on one of the side surfaces of the display module DM and on a bottom surface of the display module DM. The driving chip DC may be provided to overlap a region of the driving circuit board DCB that is placed on the bottom surface of the display module DM.

The driving chip DC may be configured to produce various driving signals that are used to operate the display panel DP and the input sensing unit IS. The driving signals that are produced by the driving chip DC may be respectively transmitted to the display panel DP and the input sensing unit IS through the driving circuit board DCB.

In some embodiments, the display panel DP may include a top surface, a bottom surface, and side surfaces connecting the top surface to the bottom surface. A driving pad DP-PD (e.g., see FIG. 3A) may be provided on the top surface of the display panel DP. The driving pad DP-PD may be electrically connected to the driving circuit board DCB and may overlap the non-display region NDA.

The input sensing unit IS may be provided on the display panel DP in the third direction DR3 and may include a first surface, a second surface, and connection surfaces connecting the first surface to the second surface. The top surface of the display panel DP may face the first surface of the input sensing unit IS in the third direction DR3. An input pad IS-PD (e.g., see FIG. 4B) may be provided on the first surface of the input sensing unit IS. The input pad IS-PD may be electrically connected to the driving circuit board DCB and may overlap the non-display region NDA.

In some embodiments, the driving circuit DDC may be provided on a first side surface of the side surfaces of the display panel DP. Furthermore, the driving circuit DDC may be provided on a first connection surface of the connection surfaces of the input sensing unit IS that is aligned to the first side surface of the display panel DP. The driving circuit DDC may be electrically connected to the display panel DP and the input sensing unit IS, respectively.

In the following description, the first side surface of the display panel DP will be described as a side surface adjacent to the driving pad DP-PD, and the first connection surface of the input sensing unit IS will be described as a connection surface adjacent to the input pad IS-PD.

According to some embodiments of the inventive concept, the display device DD may be configured to have a display region to be larger than the display area DA of the display module DM that is shown in FIG. 1. In this case, the driving circuit DDC may be provided in an inner region of the display module DM. Hereinafter, the inner region of the display module DM may refer to a region of the display panel DP or the input sensing unit IS that overlaps the non-display region NDA. That is, in the case where the driving circuit DDC is provided in the inner region of the display module DM, the display module DM includes a region corresponding to at least a portion of the driving circuit DDC. By contrast, according to some embodiments of the inventive concept, it may be possible to increase an area of the display region DA by an area of the region corresponding to the portion of the driving circuit DDC.

Figure 3A:
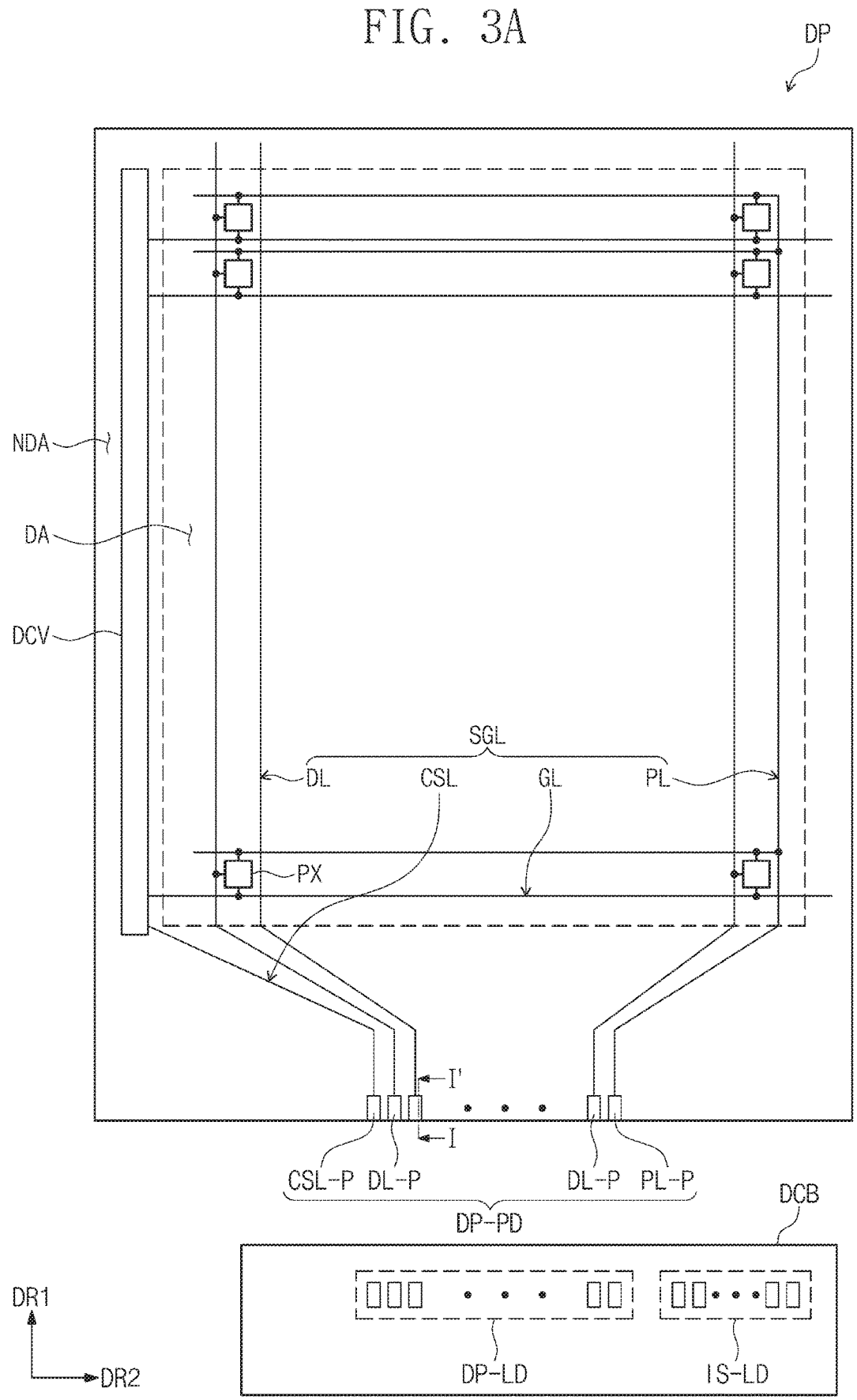
FIG. 3A is a plan view illustrating a display panel according to some embodiments of the inventive concept.
Figure 3B:
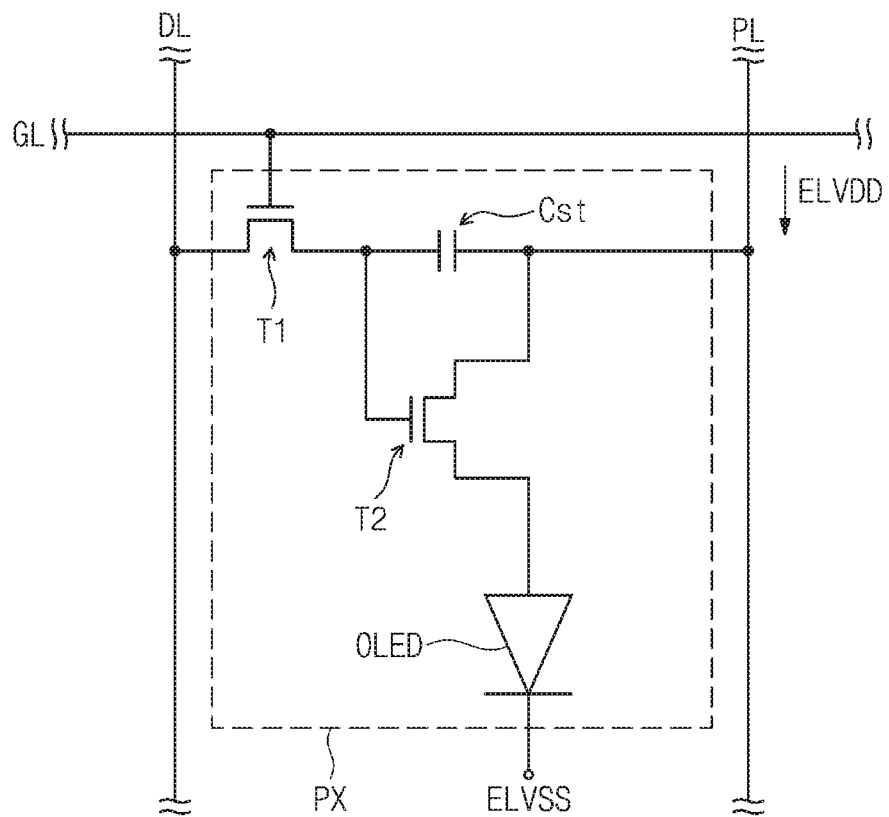
FIG. 3B is an equivalent circuit diagram of a pixel shown in FIG. 3A.
Figure 3C:
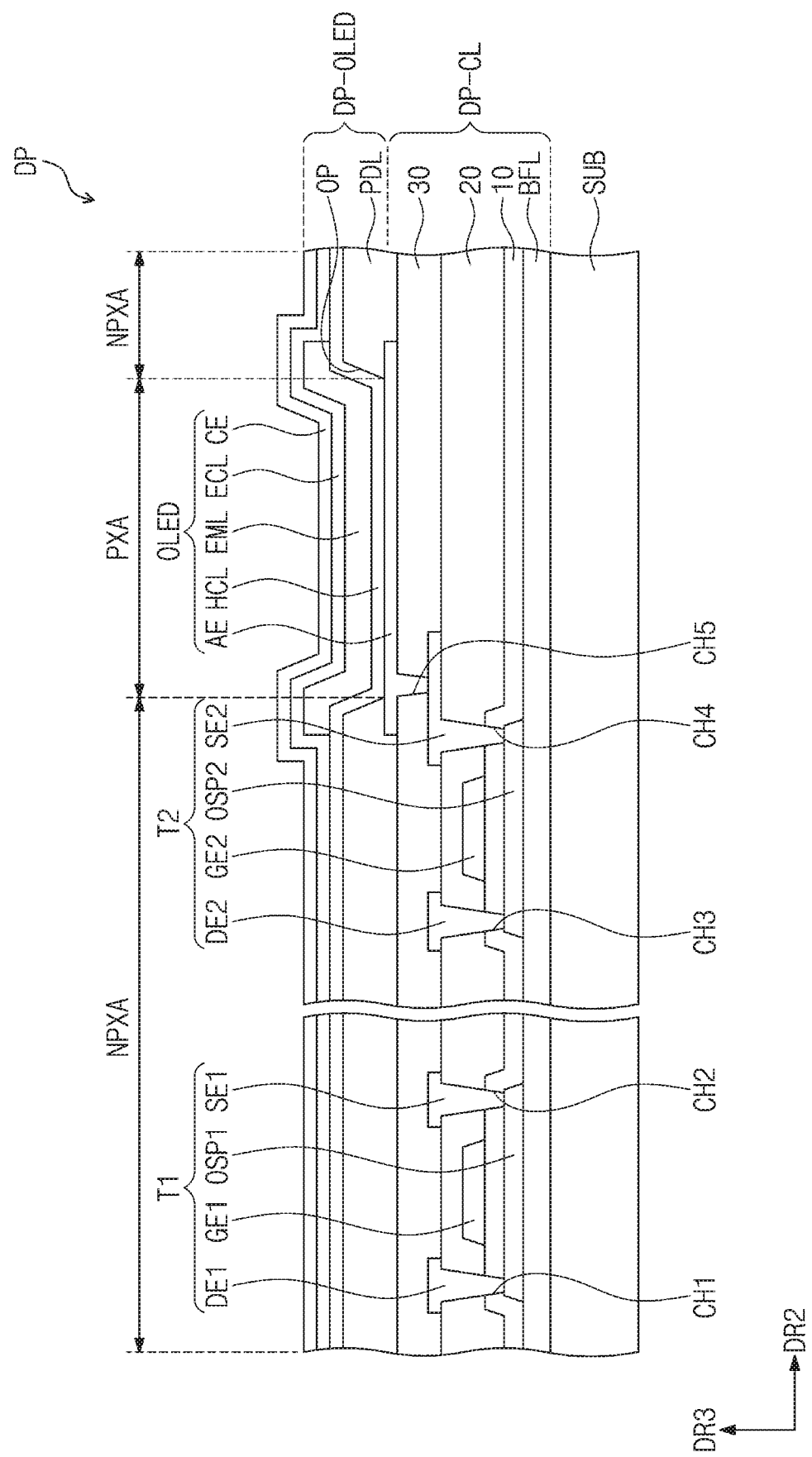
FIG. 3C is a sectional view illustrating a portion of a display panel according to some embodiments of the inventive concept.

FIG. 3A is a plan view illustrating a display panel according to some embodiments of the inventive concept. FIG. 3B is an equivalent circuit diagram of a pixel shown in FIG. 3A. FIG. 3C is a sectional view illustrating a portion of a display panel according to some embodiments of the inventive concept.

Referring to FIGS. 3A and 3B, the display panel DP may include a plurality of signal lines SGL, a plurality of pixels PX, and a plurality of driving pads DP-PD. A region, in which the plurality of pixels PX are provided, may be defined as the display region DA.

The plurality of signal lines SGL may include gate lines GL, data lines DL, a power line PL, and a control signal line CSL. Each of the gate lines GL may be connected to corresponding ones of the plurality of pixels PX, and each of the data lines DL may be connected to corresponding ones of the plurality of pixels PX. The power line PL may be connected to the plurality of pixels PX. A gate driving circuit DCV, to which the gate lines GL are connected, may be provided in the non-display region NDA. The control signal line CSL may be used to provide control signals to the gate driving circuit DCV.

At least two of the gate lines GL, the data lines DL, the power line PL, and the control signal line CSL may be provided on the same layer, but they may be provided on different layers. Among the gate lines GL, the data lines DL, the power line PL, and the control signal line CSL, signal lines that are provided on a first layer may be referred to as first signal lines, and signal lines that are provided on a second layer may be referred to as second signal lines. Furthermore, signal lines provided on a third layer may be referred to as third signal lines.

The display panel DP may include the plurality of driving pads DP-PD that are electrically connected to the data lines DL, the power line PL, and the control signal line CSL. The driving pads DP-PD may overlap the non-display region NDA and may include a control pad CSL-P, a data pad DL-P, and a power pad PL-P.

In some embodiments, an end portion of each of the driving pads DP-PD may be aligned to a side surface of the display panel DP that is in contact with the driving circuit board DCB.

Figure 3D:
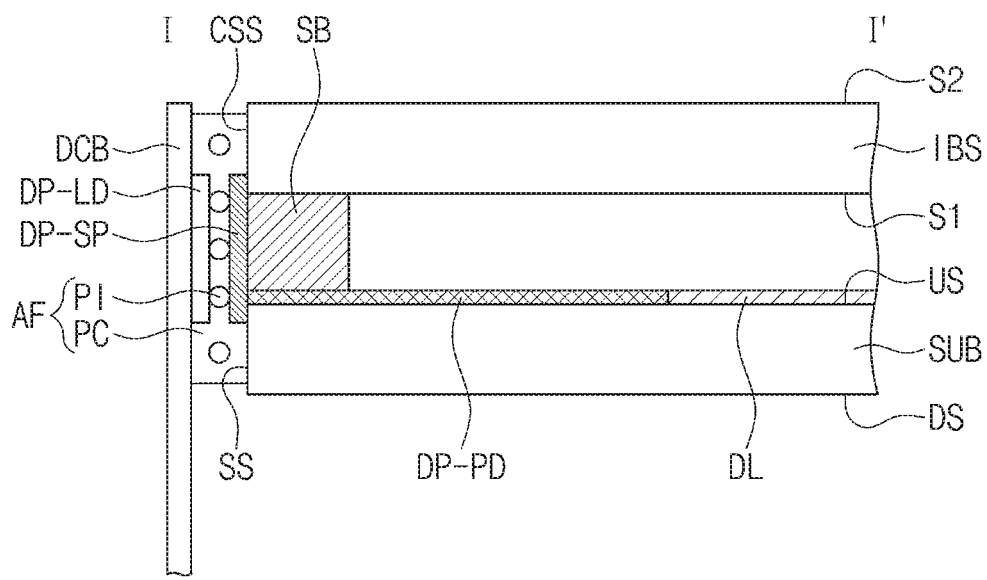
FIG. 3D is a sectional view taken along line I-I' of FIG. 3A according to one embodiment.

The driving circuit board DCB of FIG. 2B may include first pads DP-LD that are electrically and respectively connected to the driving pads DP-PD (e.g., see FIG. 3D). Furthermore, the driving circuit board DCB may include second pads IS-LD that are electrically and respectively connected to the input pads IS-PD (e.g., see FIG. 4B) in the input sensing unit IS.

FIG. 3B exemplarily illustrates one pixel PX that is connected to one of the gate lines GL, one of the data lines DL, and the power line PL. The structure of the pixel PX is not limited thereto and may be variously changed.

The pixel PX may include an organic light emitting device OLED that is used as a display device. The organic light emitting device OLED may be a top-emission type diode or a bottom-emission type diode. The pixel PX may include a first or switching transistor T1, a second or driving transistor T2, and a capacitor Cst that are used as a part of a circuit for driving the organic light emitting device OLED. The organic light emitting device OLED may be configured to generate light in response to electrical signals transmitted through the first and second transistors T1 and T2.

If a scan signal is applied to the gate line GL, the first transistor T1 may output a data signal applied to the data line DL in response to the scan signal. The capacitor Cst may be charged to have a voltage corresponding to the data signal that is transmitted through the first transistor T1.

The second transistor T2 may be connected to the organic light emitting device OLED. The second transistor T2 may control a driving current flowing through the organic light emitting device OLED, based on an amount of charges stored in the capacitor Cst. The organic light emitting device OLED may emit light when the second transistor T2 is turned-on flowing the driving current through the organic light emitting device OLED.

Referring to FIG. 3C, the display panel DP may include a base substrate SUB, a circuit layer DP-CL, and a display device layer DP-OLED.

The circuit layer DP-CL and the display device layer DP-OLED may be sequentially provided on the base substrate SUB. In some embodiments, the circuit layer DP-CL may include a buffer layer BFL, a first insulating layer 10, and a second insulating layer 20s, and a third insulating layer 30. At least one or each of the first to third insulating layers 10, 20, and 30 may be provided to include at least one of an inorganic layer and an organic layer. The inventive concept is not limited to specific materials for the inorganic and organic layers. Furthermore, in certain embodiments, the buffer layer BFL may be optionally provided or may be omitted.

A semiconductor pattern OSP1 (hereinafter, a first semiconductor pattern) of the first transistor T1 and a semiconductor pattern OSP2 (hereinafter, a second semiconductor pattern) of the second transistor T2 may be provided on the buffer layer BFL. The first semiconductor pattern OSP1 and the second semiconductor pattern OSP2 may be formed of or include at least one of amorphous silicon, poly silicon, and metal oxide semiconductor materials.

The first insulating layer 10 may be provided on the first semiconductor pattern OSP1 and the second semiconductor pattern OSP2. A control electrode GE1 (hereinafter, a first control electrode) of the first transistor T1 and a control electrode GE2 (hereinafter, a second control electrode) of the second transistor T2 may be provided on the first insulating layer 10. The first control electrode GE1 and the second control electrode GE2 may be formed by the same patterning process (e.g., including a photolithography step) as that for forming the gate lines GL (e.g., see FIG. 3A).

The second insulating layer 20 may be provided on the first insulating layer 10 to cover the first control electrode GE1 and the second control electrode GE2. An input electrode DE1 (hereinafter, a first input electrode) and an output electrode SE1 (hereinafter, a first output electrode) of the first transistor T1, and an input electrode DE2 (hereinafter, a second input electrode) and an output electrode SE2 (hereinafter, a second output electrode) of the second transistor T2 may be provided on the second insulating layer 20.

The first input electrode DE1 and the first output electrode SE1 may be connected to the first semiconductor pattern OSP1, respectively, through a first through hole CH1 and a second through hole CH2 that are formed to penetrate the first insulating layer 10 and the second insulating layer 20. Similarly, the second input electrode DE2 and the second output electrode SE2 may be connected to the second semiconductor pattern OSP2, respectively, through a third through hole CH3 and a fourth through hole CH4 that are formed to penetrate the first insulating layer 10 and the second insulating layer 20. In certain embodiments, at least one of the first transistor T1 and the second transistor T2 may be provided to have a bottom gate structure.

The third insulating layer 30 may be provided on the second insulating layer 20 to cover the first input electrode DE1, the second input electrode DE2, the first output electrode SE1, and the second output electrode SE2. The third insulating layer 30 may be configured to provide a flat surface.

The display device layer DP-OLED may be provided on the third insulating layer 30. The display device layer DP-OLED may include a pixel definition layer PDL and an organic light emitting device OLED. The pixel definition layer PDL may be formed of or include an organic material. A first electrode AE may be provided on the third insulating layer 30. The first electrode AE may be connected to the second output electrode SE2 through a fifth through hole CH5 that penetrates the third insulating layer 30. The pixel definition layer PDL may be provided to define an opening OP. The opening OP of the pixel definition layer PDL may be provided to expose at least a portion of the first electrode AE. In certain embodiments, the pixel definition layer PDL may be omitted.

The pixel PX may be provided in a display region DP-DA. The display region DP-DA may include a light-emitting region PXA and a non-light-emitting region NPXA that is located adjacent to the light-emitting region PXA. The non-light-emitting region NPXA may be provided to surround the light-emitting region PXA. In some embodiments, the light-emitting region PXA may be defined to correspond to a region of the first electrode AE that is exposed by the opening OP.

In certain embodiments, the light-emitting region PXA may overlap at least one of the first and second transistors T1 and T2. The opening OP may be enlarged, and moreover, not only the first electrode AE but also a light emitting layer EML to be described below may be enlarged.

A hole control layer HCL may be commonly provided in the light-emitting region PXA and the non-light-emitting region NPXA. Although not shown, a common layer such as the hole control layer HCL may be commonly provided in a plurality of pixels PX (e.g., see FIG. 3A).

The light emitting layer EML may be provided on the hole control layer HCL. The light emitting layer EML may be locally provided on a region corresponding to the opening OP. In other words, the light emitting layer EML may be divided into a plurality of separate patterns that are formed in the plurality of pixels PX, respectively. The light emitting layer EML may be formed of or include an organic material and/or an inorganic material. The light emitting layer EML may be configured to generate a specific color light.

In the present embodiment, the light emitting layer EML is illustrated to have a patterned structure, but in certain embodiments, the light emitting layer EML may be provided in common to span the plurality of pixels PX. In this case, the light emitting layer EML may be configured to emit a white-color light. In addition, the light emitting layer EML may have a multi-layered structure referred to as a 'tandem' structure.

An electron control layer ECL may be provided on the light emitting layer EML. Although not shown, the electron control layer ECL may be provided in common on the plurality of pixels PX. A second electrode CE may be provided on the electron control layer ECL. The second electrode CE may be provided in common on the plurality of pixels PX.

Although not shown, the display device layer DP-OLED may further include an insulating layer that is provided to cover the second electrode CE.

Figure 3E:
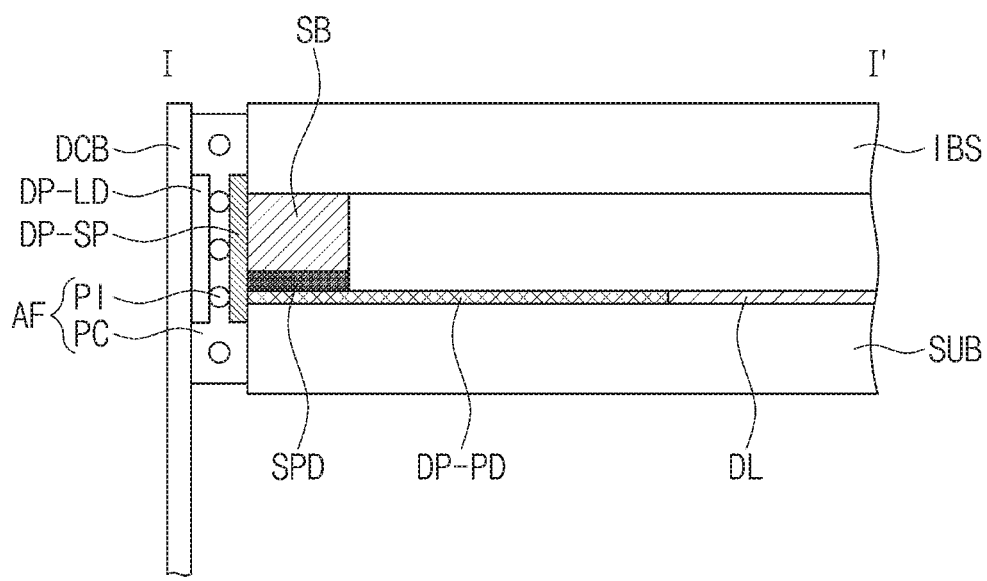
FIG. 3E is a sectional view taken along line I-I' of FIG. 3A according to another embodiment.

FIG. 3D is a sectional view taken along line I-I' of FIG. 3A according to one embodiment. FIG. 3E is a sectional view taken along line I-I' of FIG. 3A according to another embodiment.

Referring to FIG. 3D, the display device DD may include the base substrate SUB included in the display panel DP, an encapsulation substrate IBS included in the input sensing unit IS, an adhesive member SB connecting the base substrate SUB to the encapsulation substrate IBS, a driving side electrode DP-SP, the driving circuit board DCB, and an anisotropic conductive film AF.

The base substrate SUB may include a top surface US, a bottom surface DS, and side surfaces SS connecting the top surface US to the bottom surface DS. The bottom surface DS and the side surfaces SS of the base substrate SUB may be defined as a bottom surface and side surfaces of the display panel DP previously described with reference to FIG. 2B. Hereinafter, the side surface SS of the base substrate SUB shown in FIG. 3D may be referred to as a first side surface that is adjacent to the driving pad DP-PD.

The driving pad DP-PD and the data line DL that is directly connected to the driving pad DP-PD may be provided on the top surface US of the base substrate SUB. The driving pad DP-PD may include an end portion aligned to the first side surface SS and an opposite end portion connected to the data line DL. The driving pad DP-PD may be formed of or include at least one of metallic materials (e.g., copper (Cu), silver (Ag), gold (Au), or aluminum (Al)). The driving pad DP-PD and the data line DL may be provided on the same layer (e.g., on the second insulating layer 20 previously described with reference to FIG. 3C). The circuit layer DP-CL and the display device layer DP-OLED described with reference to FIG. 3C may be provided on the top surface US of the base substrate SUB.

The input sensing unit IS may include the encapsulation substrate IBS. The encapsulation substrate IBS may include a first surface S1, a second surface S2, and connection surfaces CSS connecting the first surface S1 to the second surface S2. The first surface S1 of the encapsulation substrate IBS may face the top surface US of the base substrate SUB. In addition, the second surface S2 and the connection surfaces CSS of the encapsulation substrate IBS may be defined as a top surface and connection surfaces of the input sensing unit IS described with reference to FIG. 2B. Hereinafter, the connection surface CSS of the encapsulation substrate IBS shown in FIGS. 3D and 4C will be described as a first connection surface adjacent to the input pad IS-PD.

At least one conductive layer and at least one insulating layer may be provided on the first surface S1 of the encapsulation substrate IBS and may be used to sense an external input. This will be described in more detail with reference to FIG. 4A.

The adhesive member SB may be provided between the base substrate SUB and the encapsulation substrate IBS. The adhesive member SB may correspond to the third adhesive member AM3 described with reference to FIG. 2A. The adhesive member SB may be provided along an edge region of the base substrate SUB and between the base substrate SUB and the encapsulation substrate IBS. For example, the adhesive member SB may be provided as a sealing element. In some embodiments, the adhesive member SB may be provided on the driving pad DP-PD to be aligned to the first side surface SS of the base substrate SUB and to support the driving side electrode DP-SP.

The driving side electrode DP-SP may be electrically connected to the driving circuit board DCB and the driving pad DP-PD. The driving side electrode DP-SP may be in direct contact with the driving pad DP-PD. The driving side electrode DP-SP may be formed of or include at least one of metallic materials (e.g., copper (Cu), silver (Ag), gold (Au), or aluminum (Al)).

In some embodiments, various methods (e.g., a silk screen method or a method of depositing a metallic material and irradiating a laser beam thereon) may be used to form the driving side electrode DP-SP on the first side surface SS of the base substrate SUB and the first connection surface CSS of the encapsulation substrate IBS.

The driving circuit board DCB may include the first pad DP-LD that is provided to face the driving side electrode DP-SP. The first pad DP-LD may be used to deliver the driving signal from the driving chip DC (e.g., see FIG. 2B) to the driving side electrode DP-SP. In some embodiments, the number of the first pads DP-LD included in the driving circuit board DCB may correspond to the number of the driving pads DP-PD provided on the base substrate SUB.

In addition, the first pad DP-LD may be configured to transmit driving signals to the driving side electrode DP-SP through the anisotropic conductive film AF. The anisotropic conductive film AF may include an adhesive film PC that is formed to have an adhesive property, and conductive particles PI that are provided in the adhesive film PC. The conductive particles PI may be configured to electrically connect the driving side electrode DP-SP to the first pad DP-LD.

Although the first pad DP-LD is illustrated to be electrically connected to the driving side electrode DP-SP through the anisotropic conductive film AF, the inventive concept is not limited thereto. For example, in certain embodiments, the first pad DP-LD may be directly connected to the driving side electrode DP-SP by an ultrasonic wave method.

The driving circuit board DCB may be provided on a side surface of the base and encapsulation substrates SUB and IBS and may be used to transmit the driving signals to the driving pad DP-PD, as described above. In particular, since the driving pad DP-PD is aligned to the first side surface SS and is provided on the base substrate SUB, it may be possible to reduce an area of the non-display region NDA of the display panel DP, compared to a conventional driving circuit board, a portion of which is bent to overlap a top surface of a base substrate and is bonded to a driving pad that is formed on the base substrate.

When compared with the display device of FIG. 3D, the display device of FIG. 3E may further include a sub-driving pad SPD that overlaps the adhesive member SB and is provided on the driving pad DP-PD. An end portion of the sub-driving pad SPD may be aligned to the first side surface SS to be in contact with the driving side electrode DP-SP. Owing to the sub-driving pad SPD, it may be possible to increase an electrically-connected area between the driving side electrode DP-SP and the driving pad DP-PD and consequently to improve electric characteristics of the display device.

Figure 4A:
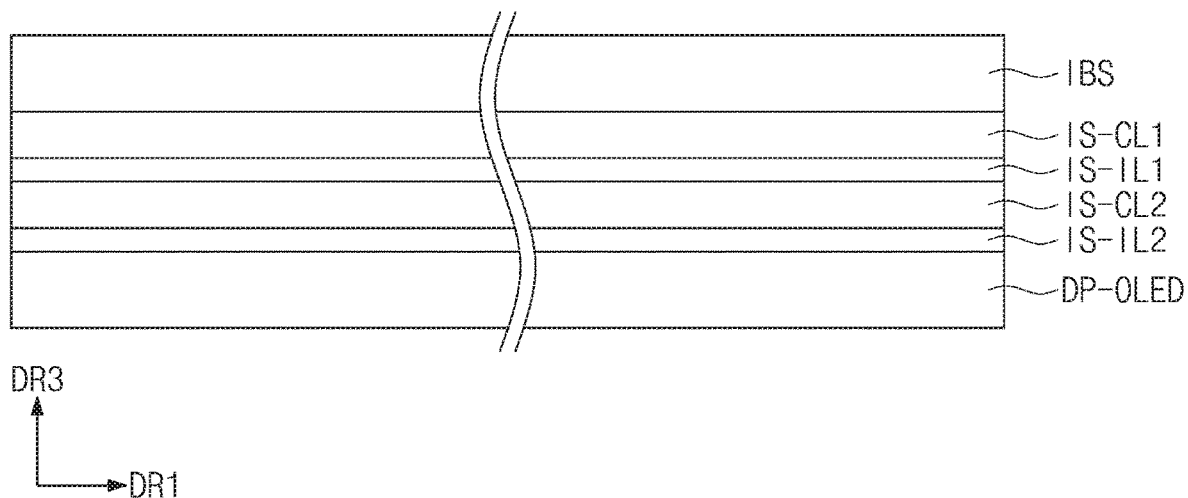
FIG. 4A is a sectional view illustrating an input sensing unit according to some embodiments of the inventive concept.
Figure 4B:
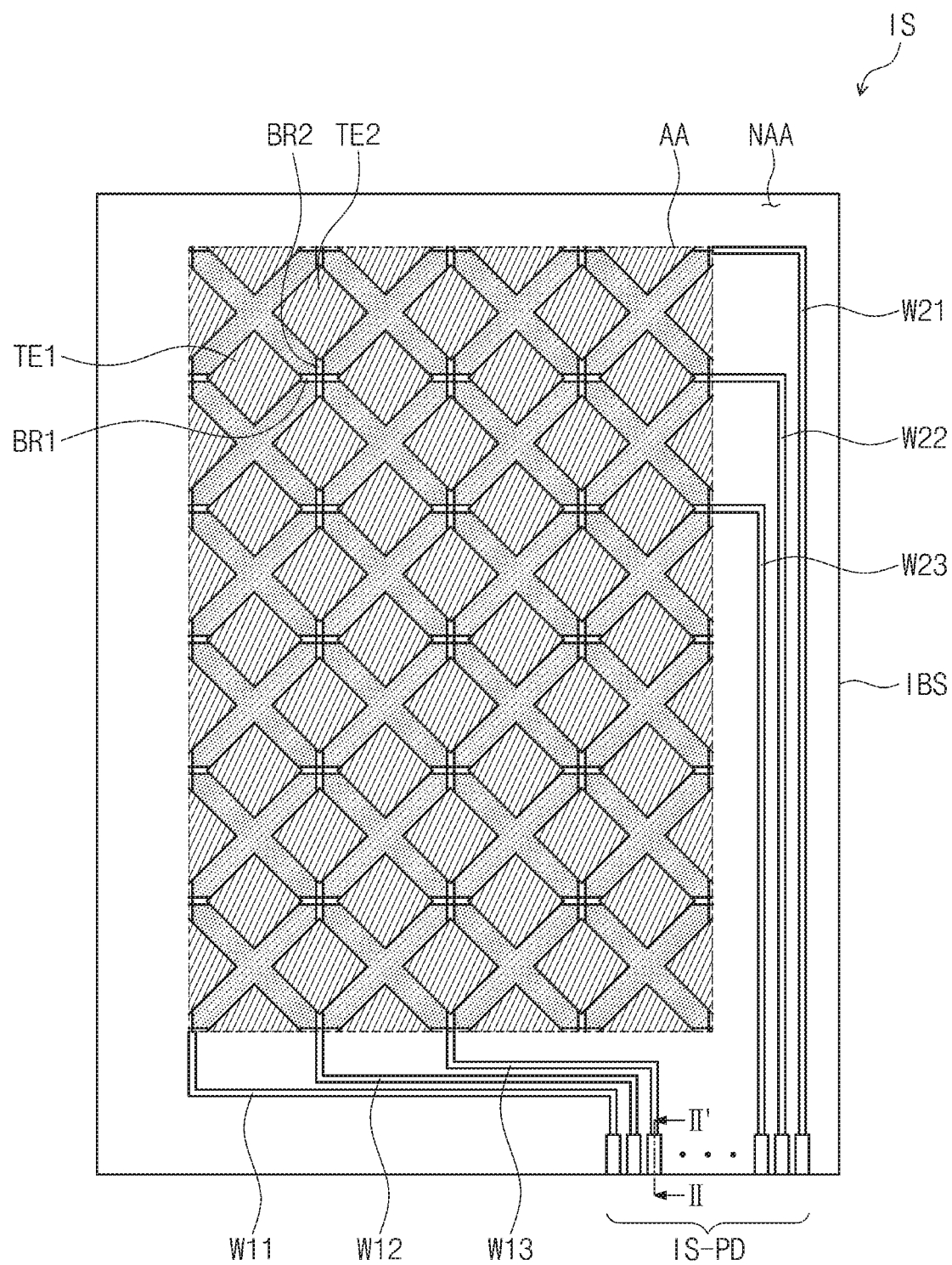
FIG. 4B is a plan view of an input sensing unit shown in FIG. 4A.
Figure 4C:
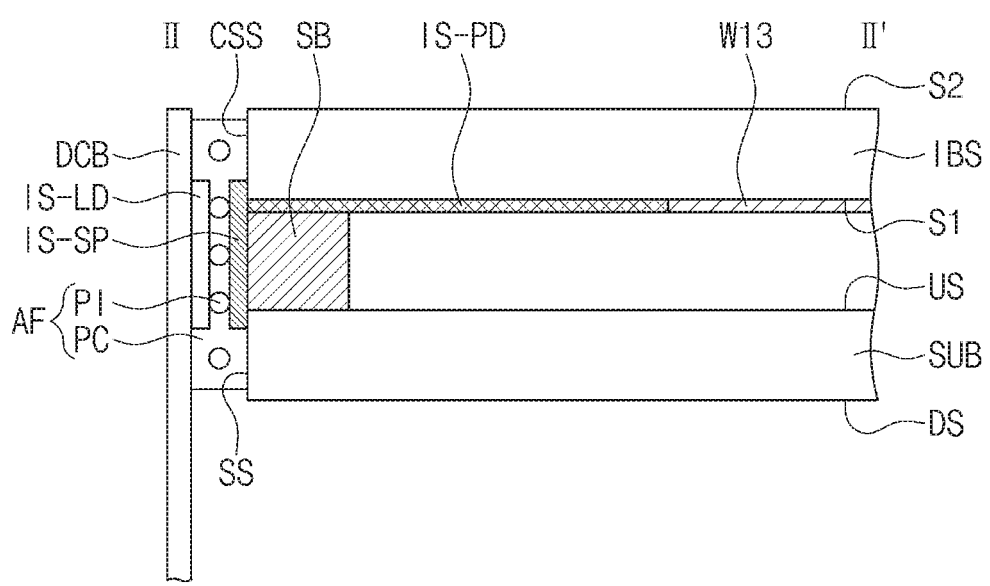
FIG. 4C is a sectional view taken along line II-IT of FIG. 4B.

FIG. 4A is a sectional view illustrating an input sensing unit according to some embodiments of the inventive concept. FIG. 4B is a plan view of an input sensing unit shown in FIG. 4A. FIG. 4C is a sectional view taken along line II-II' of FIG. 4B.

Referring to FIG. 4A, the input sensing unit IS may include the encapsulation substrate IBS, a first conductive layer IS-CL1, a first insulating layer IS-IL1, a second conductive layer IS-CL2, and a second insulating layer IS-IL2.

In some embodiments, the first conductive layer IS-CL1, the first insulating layer IS-IL1, the second conductive layer IS-CL2, and the second insulating layer IS-IL2 may be sequentially stacked on the encapsulation substrate IBS. Thus, the second insulating layer IS-IL2 may be provided to face the display device layer DP-OLED of the display panel DP with the adhesive member SB (not shown in FIG. 4A) interposed therebetween.

Each of the first and second conductive layers IS-CL1 and IS-CL2 may have a single-layered structure or may have a multi-layered structure including a plurality of layers stacked in the third direction DR3. In some embodiments, a conductive layer of the multi-layered structure may be configured to include a transparent conductive layer and at least one metal layer. In certain embodiments, a conductive layer of the multi-layered structure may include at least two metal layers containing different metals. The transparent conductive layers may be formed of or include at least one of indium tin oxide (ITO), indium zinc oxide (IZO), zinc oxide (ZnO), indium tin zinc oxide (ITZO), PEDOT, metal nano wire, and graphene. The metal layer may be formed of or include at least one of molybdenum, silver, titanium, copper, aluminum, and any alloy thereof.

Each of the first and second conductive layers IS-CL1 and IS-CL2 may include a plurality of sensing electrodes. Hereinafter, the sensing electrodes in the first conductive layer IS-CL1 will be referred to as 'first sensing electrodes', and the sensing electrodes in the second conductive layer IS-CL2 will be referred to as 'second sensing electrodes'. In addition, the first and second conductive layers IS-CL1 and IS-CL2 may include signal lines, each of which is connected to the first sensing electrodes or the second sensing electrodes.

Each of the first insulating layer IS-IL1 and the second insulating layer IS-IL2 may be formed of or include an inorganic material or an organic material. The inorganic material may include silicon oxide or silicon nitride. The organic material may include at least one of acrylic resins, methacrylic resins, polyisoprene resins, vinyl resins, epoxy resins, urethane resins, cellulose resins, and perylene resins.

The first insulating layer IS-IL1 may be provided to electrically disconnect and insulate the first and second conductive layers IS-CL1 and IS-CL2 from each other, and the inventive concept is not limited to a shape of the first insulating layer IS-IL1. The shape of the first insulating layer IS-IL1 may be variously changed, depending on shapes and/or patterns of the first and second conductive layers IS-CL1 and IS-CL2.

In the embodiment shown in FIG. 4A, the input sensing unit IS has a double-layered structure for an electrostatic capacitance sensing. However, the input sensing unit IS may be operated in a self-capacitance manner, and a method of operating the input sensing unit IS is not limited thereto as long as it can be used to obtain coordinate information of an external input.

Referring to FIG. 4B, the input sensing unit IS may include a plurality of first sensing electrodes, a plurality of second sensing electrodes, a plurality of signal lines W11, W12, W13, W21, W22, and W23, and a plurality of input pads IS-PD.

The first sensing electrodes and the second sensing electrodes may be provided in an active region AA of the input sensing unit IS. The first sensing electrodes may be arranged in the first direction DR1 and may have a shape extending in the second direction DR2. Each of the first sensing electrodes may include a plurality of first sensor units TE1 and a plurality of first connecting portions BR1 connecting adjacent first sensor units TE1. In some embodiments, n first sensing electrodes may be arranged in the first direction DR1, where n is a natural number. The description that follows will refer to an example in which the input sensing unit IS includes n first sensing electrodes.

In some embodiments, the first and n-th electrodes of the n first sensing electrodes may be located at positions that are closest to a non-active region NAA of the input sensing unit IS. As shown in FIG. 4B, the first and n-th electrodes of the n first sensing electrodes may be located to be closest to the non-active region NAA and to face each other in the first direction DR1. In some embodiments, the first sensor units that are included in the first and n-th electrodes of the n first sensing electrodes may be provided to have a different shape from the first sensor units that are included in the second and (n−1)-th electrodes of the n first sensing electrodes.

As an example, each of the first sensor units that are included in the first and n-th electrodes of the n first sensing electrodes may have substantially the same shape as that of a portion of each of the first sensor units that are included in the second and (n−1)-th electrodes of the n first sensing electrodes.

The second sensing electrodes may be electrically disconnected and insulated from the first sensing electrodes. The second sensing electrodes may be arranged in the second direction DR2 and may have a shape extending in the first direction DR1. Each of the second sensing electrodes may include a plurality of second sensor units TE2 and a plurality of second connecting portions BR2 connecting adjacent second sensor units TE2. In some embodiments, m second sensing electrodes may be arranged in the second direction DR2, where m is a natural number. The description that follows will refer to an example in which the input sensing unit IS includes m second sensing electrodes.

In some embodiments, the first and m-th electrodes of the m second sensing electrodes may be located at positions that are closest to the non-active region NAA. The first and m-th electrodes of the second sensing electrodes may be located to be closest to the non-active region NAA and to face each other in the second direction DR2. In some embodiments, the second sensor units that are included in the first and m-th electrodes of the second sensing electrodes may be provided to have a different shape from the second sensor units that are included in the second and (m−1)-th electrodes of the second sensing electrodes.

As an example, each of the second sensor units that are included in the first and m-th electrodes of the second sensing electrodes may have substantially the same shape as that of a portion of each of the second sensor units that are included in the second and (m−1)-th electrodes of the second sensing electrodes.

The input sensing unit IS may be configured to measure a variation in capacitance (hereinafter, first capacitance) of the first sensing electrodes, and to measure a variation in capacitance (hereinafter, second capacitance) of the second sensing electrodes that may occur when there is an external touch event onto the input sensing unit IS. The variations of the first capacitance and the second capacitance measured by the input sensing unit IS may be used to calculate a coordinate of an input (e.g., the external touch event).

The first sensor units TE1 may be configured to output sensing signals, and the second sensor units TE2 may be configured to receive driving signals. For example, the driving signals may be applied to the second sensor units TE2 to scan the active region AA, and the sensing signal that is output from the first sensor units TE1 may be used to determine a position of the touch event. In certain embodiments, the first sensor units TE1 may be configured to receive the driving signals, and the second sensor units TE2 may be configured to output the sensing signals. Furthermore, the first sensor units TE1 and/or the second sensor units TE2 may be configured to additionally receive or output other signals.

However, the inventive concept is not limited to this example, and for example, the input sensing unit IS may be configured to sense an external touch in various manners including, but not limited to, resistive sensing, optical, ultrasonic wave, or any other coordinate sensing manners, and may be provided to have an electrode structure corresponding thereto.

A plurality of signal lines and a plurality of input pads IS-PD may be provided on the non-active region NAA. Some of the signal lines (e.g., the first signal lines W11, W12, and W13 and the second signal lines W21, W22, and W23) are exemplarily illustrated to reduce complexity in the drawings and to provide better understanding of example embodiments of the inventive concept. End portions of the first signal lines W11, W12, and W13 may be connected to the second sensing electrodes, respectively, and end portions of the second signal lines W21, W22, and W23 may be connected to the first sensing electrodes, respectively. Each of unillustrated ones of the signal lines may be connected to a corresponding electrode of the first and second sensing electrodes.

The input pads IS-PD may be provided in a portion of the non-active region NAA. The input pads IS-PD may be aligned to an end portion of the encapsulation substrate IBS. The input sensing unit IS may be electrically connected to a power line PL (not shown in FIG. 4B) and a driving circuit DDC (not shown in FIG. 4B) through the input pads IS-PD.

In addition, the input pads IS-PD may be electrically connected to the second pads IS-LD provided in the driving circuit board DCB of FIG. 3A. That is, the second pads IS-LD may be configured to transfer the driving signals that are used to operate the input sensing unit IS from the driving chip DC to the input pads IS-PD.

Referring to FIG. 4C, when compared with the driving pad DP-PD of FIG. 3D (e.g., provided on the base substrate SUB), the input pad IS-PD may be provided on the first surface S1 of the encapsulation substrate IBS, and an end portion of the input pad IS-PD may be aligned to the first connection surface CSS of the encapsulation substrate IBS. In addition, the third signal line W13 that is directly connected to the input pad IS-PD may be provided on the first surface S1 of the encapsulation substrate IBS. In some embodiments, the input pad IS-PD and the third signal line W13 may be placed on the same layer and may be included in the first conductive layer IS-CL1 described with reference to FIG. 4A.

As described above, the adhesive member SB may be provided between the base substrate SUB and the encapsulation substrate IBS. The adhesive member SB may be provided on the input pad IS-PD and may be aligned to the first connection surface CSS of the encapsulation substrate IBS to support an input side electrode IS-SP. For example, the adhesive member SB may be provided along an edge of the encapsulation substrate IBS and between the base substrate SUB and the encapsulation substrate IBS.

The input side electrode IS-SP may be electrically connected to the driving circuit board DCB and the input pad IS-PD. The input side electrode IS-SP may be in direct contact with the input pad IS-PD. The input side electrode IS-SP may be formed of or include at least one of metallic materials (e.g., copper (Cu), silver (Ag), gold (Au), or aluminum (Al)).

In some embodiments, various methods (e.g., a silk screen method or a method of depositing a metallic material and irradiating a laser beam thereon) may be used to form the input side electrode IS-SP on the first connection surface CSS of the encapsulation substrate IBS and the first side surface SS of the base substrate SUB.

The driving circuit board DCB may include the second pad IS-LD facing the input side electrode IS-SP. The second pad IS-LD may be configured to transmit the driving signal that is provided from the driving chip DC (e.g., see FIG. 2B) to the input side electrode IS-SP. In some embodiments, the number of the second pads IS-LD provided in the driving circuit board DCB may correspond to the number of the input pads IS-PD provided on the encapsulation substrate IBS.

In addition, the second pad IS-LD may be configured to transmit driving signals to the input side electrode IS-SP through the anisotropic conductive film AF. The anisotropic conductive film AF may include the adhesive film PC that is formed to have an adhesive property, and the conductive particles PI that are provided in the adhesive film PC. The conductive particles PI may be configured to electrically connect the input side electrode IS-SP to the second pad IS-LD.

Although the second pad IS-LD is illustrated to be electrically connected to the input side electrode IS-SP through the anisotropic conductive film AF, the inventive concept is not limited thereto. For example, in certain embodiments, the second pad IS-LD may be directly connected to the input side electrode IS-SP by an ultrasonic wave method.

The driving circuit board DCB may be provided on a side surface of the base and encapsulation substrates SUB and IBS and may be used to transmit the driving signals to the input pad IS-PD, as described above. In particular, since the input pad IS-PD is aligned to the first connection surface CSS and is provided on the encapsulation substrate IBS, it may be possible to reduce an area of the non-display region NDA of the display panel DP, compared to a conventional driving circuit board, a portion of which is bent to overlap a top surface of a base substrate and is bonded to a driving pad that is formed on the base substrate.

Figure 5:
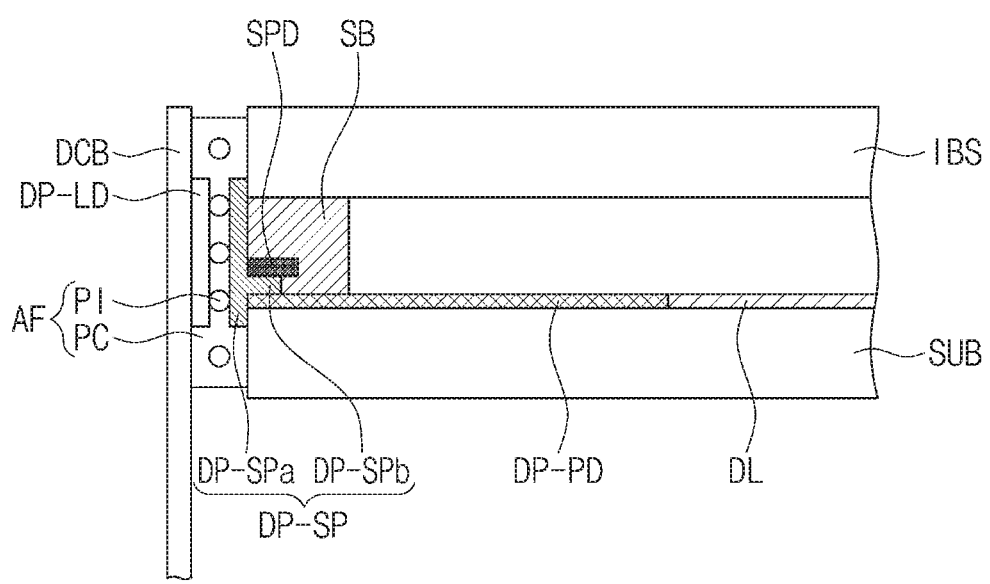
FIG. 5 is a sectional view illustrating a display device according to another embodiment of the inventive concept.
Figure 6A:
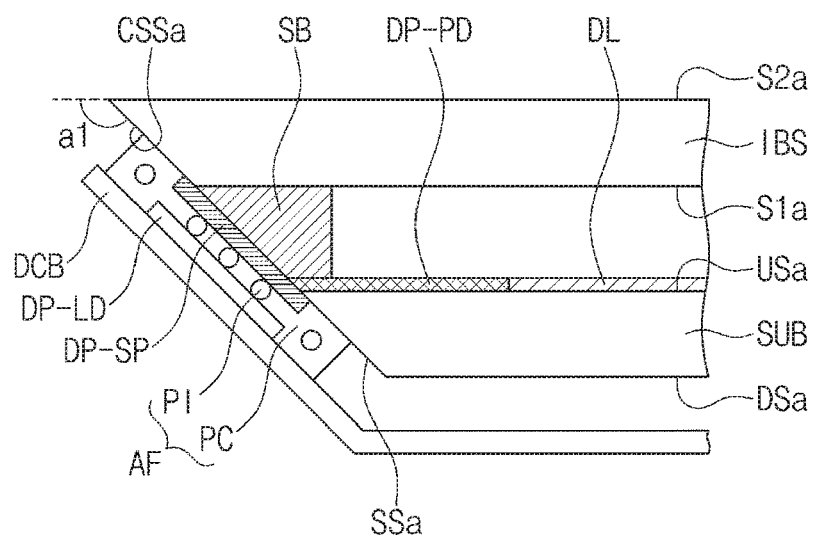
FIG. 6A is a sectional view illustrating a display device according to another embodiment of the inventive concept.
Figure 6B:
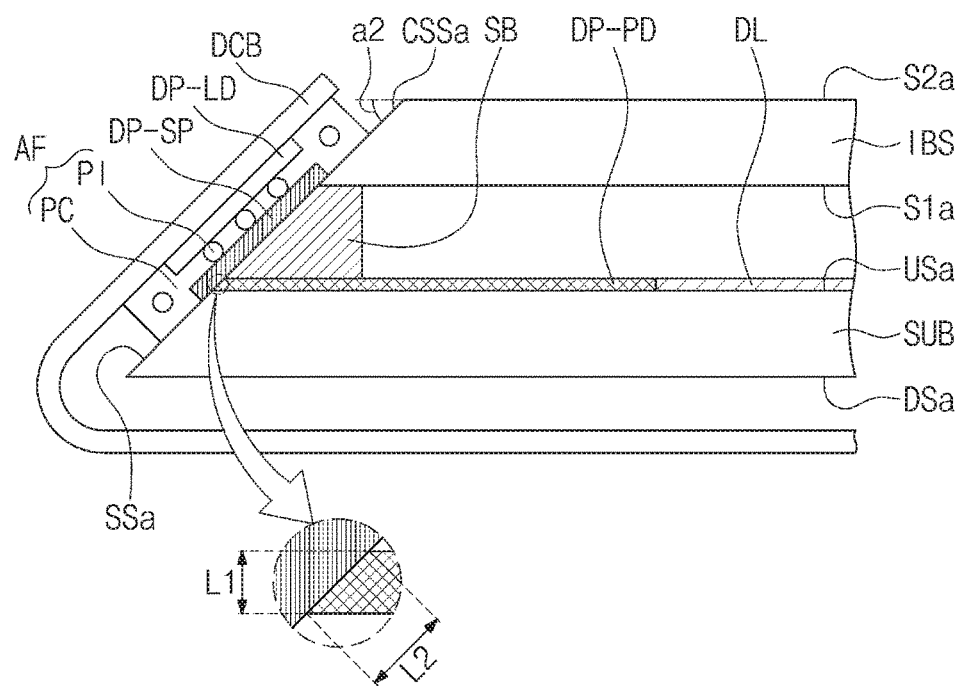
FIG. 6B is a sectional view illustrating a display device according to another embodiment of the inventive concept.

FIG. 5 is a sectional view illustrating a display device according to another embodiment of the inventive concept. FIG. 6A is a sectional view illustrating a display device according to another embodiment of the inventive concept. FIG. 6B is a sectional view illustrating a display device according to another embodiment of the inventive concept.

Except for the structural difference of the driving side electrode, the display device shown in FIG. 5 may be configured to have substantially the same features as those of the display device of FIG. 3D. For concise description, a previously described element may be identified by the same reference number without repeating description thereof.

Referring to FIG. 5, the driving side electrode DP-SP may include a first side electrode DP-Spa that is provided on the first side surface SS and the first connection surface CSS, and a second side electrode DP-SPb that is extended from the first side electrode DP-Spa and is provided on the driving pad DP-PD to overlap at least a portion of the driving pad DP-PD in the third direction DR3.

In addition, the sub-driving pad SPD may be provided on the second side electrode DP-SPb. The sub-driving pad SPD may be in contact with the first side electrode DP-SPa and the second side electrode DP-SPb. In some embodiments, the sub-driving pad SPD may be omitted.

Referring to FIGS. 6A and 6B, a first side surface SSa and a first connection surface CSSa may be inclined at an angle. For example, when measured relative to the first direction DR1, an angle of the first side surface SSa and an angle of the first connection surface CSSa are supplementary angles (adding up to 180 degrees).

As an example, as shown in FIG. 6A, the angle a1 of the first connection surface CSSa relative to the first direction DR1 may be an obtuse angle. In this case, the second surface S2a of the encapsulation substrate IBS may be longer than the first surface S1a of the encapsulation substrate IBS, when measured in the first direction DR1. The first surface S1a of the encapsulation substrate IBS may be longer than the top surface USa of the base substrate SUB. The top surface USa of the base substrate SUB may be longer than the bottom surface DSa of the base substrate SUB.

As another example, as shown in FIG. 6B, the angle a2 of the first connection surface CSSa relative to the first direction DR1 may be an acute angle. In this case, the second surface S2a of the encapsulation substrate IBS may be shorter than the first surface S1a of the encapsulation substrate IBS, when measured in the first direction DR1. The first surface S1a of the encapsulation substrate IBS may be shorter than the top surface USa of the base substrate SUB. The top surface USa of the base substrate SUB may be shorter than the bottom surface DSa of the base substrate SUB.

Since, as described above, each of the first side surface SSa and the first connection surface CSSa has an inclined shape, a contact area between the driving side electrode DP-SP and the driving pad DP-PD may be increased.

Referring to FIG. 6B, a contact interface between the driving side electrode DP-SP and the driving pad DP-PD has an inclined shape, therefore a contact area of the interface therebetween may be increased. In a case where the first side surface SS and the first connection surface CSS are aligned to each other, a length of a contact region between the driving side electrode DP-SP and the driving pad DP-PD is referred to as a first length L1. In a case where each of the first side surface SSa and the first connection surface CSSa is inclined, a length of a contact region between the driving side electrode DP-SP and the driving pad DP-PD is referred to as a second length L2.

In this case, the first length L1 may be shorter than the second length L2, as shown in FIG. 6B. If the driving side electrode DP-SP is in contact with the driving pad DP-PD, a contact area therebetween may be increased, and electric characteristics of the display device may be improved.

Furthermore, the structures described with reference to FIGS. 6A and 6B may be similarly applied to the structure between the input pad IS-PD and the input side electrode IS-SP.

Figure 7:
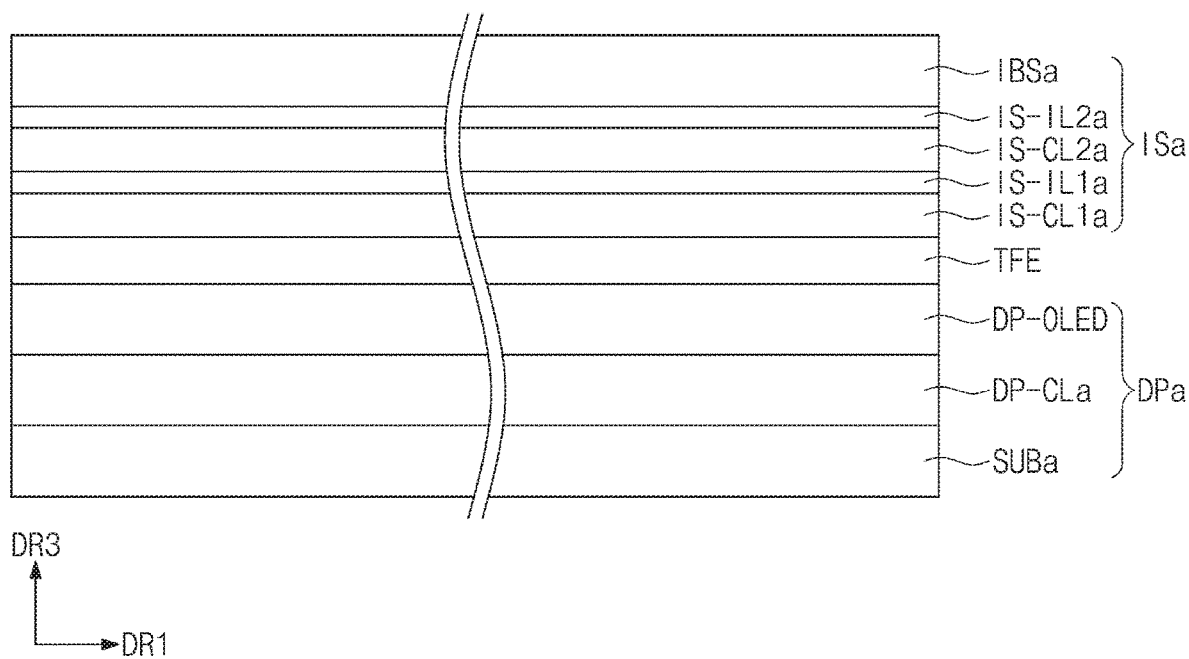
FIG. 7 is a sectional view illustrating a display device according to another embodiment of the inventive concept.

FIG. 7 is a sectional view illustrating a display device according to another embodiment of the inventive concept.

In the display device shown in FIG. 7, a thin encapsulation layer TFE may be provided between an input sensing unit ISa and a display panel DPa, and the adhesive member SB connecting the input sensing unit IS to the display panel DP may be omitted. Except for these differences, the display device of FIG. 7 may be configured to have the substantially similar features as those of the display device of FIG. 4A. For concise description, a previously described element may be identified by the same reference number without repeating description thereof.

The thin encapsulation layer TFE may include at least two inorganic thin-films and an organic thin-film therebetween. The inorganic thin-films may protect the organic light emitting device OLED from moisture, and the organic thin-film may protect the organic light emitting device OLED from foreign substances (e.g., dust particles).

The first sensing electrodes that are included in the first conductive layer IS-CL1a may be directly disposed on the thin encapsulation layer TFE. In addition, the first insulating layer IS-IL1a may be provided on the first conductive layer IS-CL1a to cover the first sensing electrodes. The second sensing electrodes that are included in the second conductive layer IS-CL2a may be directly disposed on the first insulating layer IS-IL1a. The second insulating layer IS-IL2a may be provided on the second conductive layer IS-CL2a to cover the second sensing electrodes.

The input sensing unit ISa includes a cover substrate IBSa that may be provided on the second insulating layer IS-IL2a. Here, the cover substrate IBSa may include a first surface facing the second insulating layer IS-IL2a, a second surface facing the first surface, and connection surfaces connecting the first surface to the second surface. In this case, the second surface and the connection surfaces of the cover substrate IBSa may be defined as connection surfaces of the input sensing unit ISa. That is, the driving circuit board DCB may be provided on the first connection surface that is one of the connection surfaces of the cover substrate IBSa. The display panel DPa may include a base substrate SUBa, a circuit layer DP-CLa, and the display device layer DP-OLED.

According to some embodiments of the inventive concept, a driving circuit board may be provided to deliver driving signals that are used to operate a display device. The driving circuit board may be provided on a side surface of a display panel and an input sensing unit to increase an area of a display region.

While example embodiments of the inventive concept have been particularly shown and described, it will be understood by one of ordinary skill in the art that variations in form and detail may be made therein without departing from the spirit and scope of the attached claims.

What is claimed is:

1. A display device, comprising:
a display panel comprising a base substrate, in which a display region and a non-display region adjacent to the display region are defined, and a driving pad, wherein the base substrate includes a top surface, a bottom surface, and side surfaces connecting the top surface to the bottom surface, and wherein the driving pad is provided in the non-display region on the top surface of the base substrate;
an input sensing unit comprising an encapsulation substrate and an input pad, wherein the encapsulation substrate includes a first surface facing the top surface of the base substrate, a second surface, and connection surfaces connecting the first surface to the second surface, and wherein the input pad is provided in the non-display region on the first surface of the encapsulation substrate; and
a driving circuit board extending in a thickness direction of the display panel and disposed on a first side surface of the base substrate among the side surfaces that is adjacent to the driving pad, and on a first connection surface of the encapsulation substrate among the connection surfaces that is adjacent to the input pad,
wherein the driving circuit board is electrically connected to the driving pad via a driving side electrode and is electrically connected to the input pad via an input side electrode, respectively, and
wherein at least one of the driving side electrode and the input side electrode extends between the base substrate and the encapsulation substrate in a cross-sectional view and electrically contacts at least a portion of the first connection surface of the encapsulation substrate or at least a portion the first side surface of the base substrate.

2. The display device of claim 1, wherein the driving side electrode contacts the first side surface and the first connection surface.

3. The display device of claim 1, wherein an end portion of the driving pad is aligned to the first side surface and is in contact with the driving side electrode.

4. The display device of claim 1, wherein the driving circuit board comprises a pad that is provided to face the driving side electrode and is electrically connected to the driving side electrode.

5. The display device of claim 4, further comprising an anisotropic conductive film that is provided between the driving side electrode and the pad to electrically connect the driving side electrode to the pad.

6. The display device of claim 1, further comprising a sub-driving pad that is in contact with the driving side electrode and is provided on the driving pad to electrically connect the driving side electrode to the driving pad.

7. The display device of claim 1, wherein the driving side electrode comprises a first side electrode that is provided on the first side surface and the first connection surface, and a second side electrode that is extended from the first side electrode and is provided on the driving pad.

8. The display device of claim 7, further comprising a sub-driving pad that is in contact with the first side electrode and is provided on the second side electrode.

9. The display device of claim 1, wherein the input side electrode contacts the first side surface and the first connection surface.

10. The display device of claim 1, wherein an end portion of the input pad is aligned to the first connection surface and is in contact with the input side electrode.

11. The display device of claim 1, wherein the driving circuit board comprises a pad that is provided to face the input side electrode and is electrically connected to the input side electrode.

12. The display device of claim 1, further comprising an adhesive member that is provided between the top surface and the first surface to connect the display panel to the input sensing unit.

13. The display device of claim 12, wherein the input sensing unit further comprises:
a conductive layer provided on the first surface of the encapsulation substrate, the conductive layer including sensing electrodes; and
an insulating layer provided on the conductive layer,
wherein the insulating layer is spaced apart from the top surface of the base substrate with the adhesive member interposed therebetween,
wherein the input pad is electrically connected to the sensing electrodes.

14. The display device of claim 12, wherein the adhesive member is provided to surround the display region and overlap the non-display region.

15. The display device of claim 1, wherein each of the first side surface and the first connection surface is inclined at an angle, and
an angle of the first side surface and an angle of the first connection surface are supplementary angles when measured relative to a direction perpendicular to the thickness direction of the display panel.

16. The display device of claim 15, wherein the angle of the first connection surface is acute or obtuse when measured relative to the direction perpendicular to the thickness direction of the display panel.

17. The display device of claim 1, wherein the first side surface and the first connection surface are aligned to each other in the thickness direction of the display panel.

18. A display device, comprising:
a display panel comprising a base substrate, in which a display region and a non-display region adjacent to the display region are defined, and a driving pad, wherein the base substrate includes a top surface, a bottom surface, and side surfaces connecting the top surface to the bottom surface, and wherein the driving pad is provided in the non-display region on the top surface of the base substrate;
a thin encapsulation layer provided on the top surface of the base substrate to cover the driving pad;
an input sensing unit provided on the thin encapsulation layer, wherein the input sensing unit includes a cover substrate and an input pad, wherein the cover substrate comprises a first surface, a second surface, and connection surfaces connecting the first surface to the second surface, and wherein the input pad is provided in the non-display region on the first surface; and
a driving circuit board extending in a thickness direction of the display panel and disposed on a first side surface of the base substrate among the side surfaces that is adjacent to the driving pad, and on a first connection surface of the cover substrate among the connection surfaces that is adjacent to the input pad, wherein the driving circuit board is electrically connected to the driving pad via a driving side electrode and is electrically connected to the input pad via an input side electrode, respectively, and wherein at least one of the driving side electrode and the input side electrode extends between the base substrate and the encapsulation substrate in a cross-sectional view and electrically contacts at least a portion of the first connection surface of the encapsulation substrate or at least a portion the first side surface of the base substrate.

19. The display device of claim 18, wherein the display panel further comprises:
   a circuit layer provided on the base substrate; and
   a display device layer provided on the circuit layer,
   wherein the thin encapsulation layer covers the display device layer.

20. The display device of claim 19, wherein the input sensing unit further comprises:
   a conductive layer electrically connected to the input pad, the conductive layer comprising sensing electrodes that are directly disposed on the thin encapsulation layer; and
   an insulating layer provided on the conductive layer,
   wherein the cover substrate is provided on the insulating layer.

* * * * *